(12) United States Patent
Huang et al.

(10) Patent No.: US 11,502,075 B2
(45) Date of Patent: Nov. 15, 2022

(54) METHOD OF FORMING SEMICONDUCTOR STRUCTURE

(71) Applicant: NANYA TECHNOLOGY CORPORATION, New Taipei (TW)

(72) Inventors: Ching-Chia Huang, Taipei (TW); Tseng-Fu Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 21 days.

(21) Appl. No.: 17/357,986

(22) Filed: Jun. 25, 2021

(65) Prior Publication Data

US 2021/0320104 A1 Oct. 14, 2021

Related U.S. Application Data

(62) Division of application No. 16/683,229, filed on Nov. 13, 2019, now Pat. No. 11,094,692.

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823412* (2013.01); *H01L 21/823437* (2013.01);
(Continued)

(58) Field of Classification Search
CPC . H01L 21/185; H01L 21/187; H01L 29/7813; H01L 29/7825; H01L 29/66613–66628; H01L 29/42336; H01L 29/42352; H01L 29/4236; H01L 27/088; H01L 21/823412; H01L 21/823437; H01L 29/1033; H01L 21/823425; H01L 29/66659; H01L 29/78; H01L 21/823493;
(Continued)

(56) References Cited

U.S. PATENT DOCUMENTS 6,124,612 A * 9/2000 Tihanyi ................. H01L 29/781
257/713
9,786,703 B2 10/2017 Bakhishev et al.
(Continued)

OTHER PUBLICATIONS

Young-Kwon Kim et al., "Partial Isolation Type Saddle-FinFET(Pi-FinFET) for Sub-30 nm DRAM Cell Transistors", 8, 8; doi:10.3390/electronics8010008, Electronics 2019, Journal of MDPI, Year 2019.

*Primary Examiner* — Sonya McCall-Shepard
(74) *Attorney, Agent, or Firm* — CKC & Partners Co., LLC

(57) ABSTRACT

A semiconductor structure includes a first semiconductor substrate, a second semiconductor substrate, a depletion layer, an isolation structure, a first gate structure, and a second gate structure. The first and second semiconductor substrates respectively have a first active region and a second active region overlapping the first active region. The depletion layer is disposed between the first active region and the second active region. The isolation structure surrounds the first and second active regions. The first gate structure is disposed in the second active region. The second gate structure is disposed in the second active region. The second active region has a portion between the first gate structure and the second gate structure.

5 Claims, 8 Drawing Sheets

(51) Int. Cl.
*H01L 27/108* (2006.01)
*H01L 29/10* (2006.01)
*H01L 29/36* (2006.01)
*H01L 29/423* (2006.01)
*H01L 29/66* (2006.01)
*H01L 29/78* (2006.01)

(52) U.S. Cl.
CPC ............... *H01L 21/823481* (2013.01); *H01L 27/10823* (2013.01); *H01L 29/1033* (2013.01); *H01L 29/36* (2013.01); *H01L 29/4236* (2013.01)

(58) Field of Classification Search
CPC ....... H01L 21/823481; H01L 27/10823; H01L 29/66621; H01L 27/10876; H01L 29/66712–66734; H01L 29/7802–7815; H01L 27/2454; H01L 29/7828; H01L 21/823487; H01L 21/823885
See application file for complete search history.

(56) References Cited

U.S. PATENT DOCUMENTS

| | | |
|---|---|---|
| 2017/0125515 A1 | 5/2017 | Shirakawa et al. |
| 2019/0280119 A1* | 9/2019 | Liu .................... H01L 29/0634 |
| 2019/0296017 A1 | 9/2019 | Cho et al. |

* cited by examiner

METHOD OF FORMING SEMICONDUCTOR STRUCTURE

CROSS-REFERENCE TO RELATED APPLICATION

This application is a Divisional Application of the U.S. application Ser. No. 16/683,229, filed on Nov. 13, 2019, the entirety of which is incorporated by reference herein in their entireties.

BACKGROUND

Technical Field

The present disclosure relates to a semiconductor structure and a method of forming the semiconductor structure.

Description of Related Art

With the rapid growth of electronic industry, the development of semiconductor devices has achieved high performance and miniaturization. As the size of semiconductor devices, such as dynamic random access memory (DRAM) devices, shrinks, the gate channel length decreases correspondingly. Consequently, a short channel effect may occur. To deal with such problem, a buried-channel array transistor (BCAT) device has been proposed.

However, although the recessed channel of the BCAT device has improved the short channel effect, the BCAT device suffers from low driving current and threshold voltage (Vth) sensitivity, and thus adversely affects the performance and the stability of the semiconductor device.

SUMMARY

According to one embodiment of the present disclosure, a method for forming a semiconductor structure includes the following steps. A depletion layer is formed on a first semiconductor substrate. A second semiconductor substrate is formed on the depletion layer. An isolation structure is formed in the second semiconductor substrate and surrounds the second semiconductor substrate. Two trenches are formed in the second semiconductor substrate. The first semiconductor substrate and the second semiconductor substrate are doped to respectively form a first active region and a second active region, wherein a dopant of the first active region of the first semiconductor substrate is different from a dopant of the second active region of the second semiconductor substrate. A first gate structure and a second gate structure are respectively formed in the two trenches.

In some embodiments of the present disclosure, the method of forming the semiconductor structure further includes forming a gate dielectric layer on a sidewall of the second active region of the second semiconductor substrate before forming the first gate structure and the second gate structure.

In some embodiments of the present disclosure, the method of forming the semiconductor structure further includes forming a dielectric structure on the first gate structure and the second gate structure.

In some embodiments of the present disclosure, forming the dielectric structure is such that the gate dielectric layer has a portion between the dielectric structure and the second active region of the second semiconductor substrate.

In some embodiments of the present disclosure, forming the first gate structure and the second gate structure is such that the gate dielectric layer has portions among the first gate structure, the second gate structure, and the second active region of the second semiconductor substrate.

In the aforementioned embodiments, since the depletion layer is disposed between the first active region and the second active region, higher driving current and lower threshold voltage sensitivity can be achieved. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
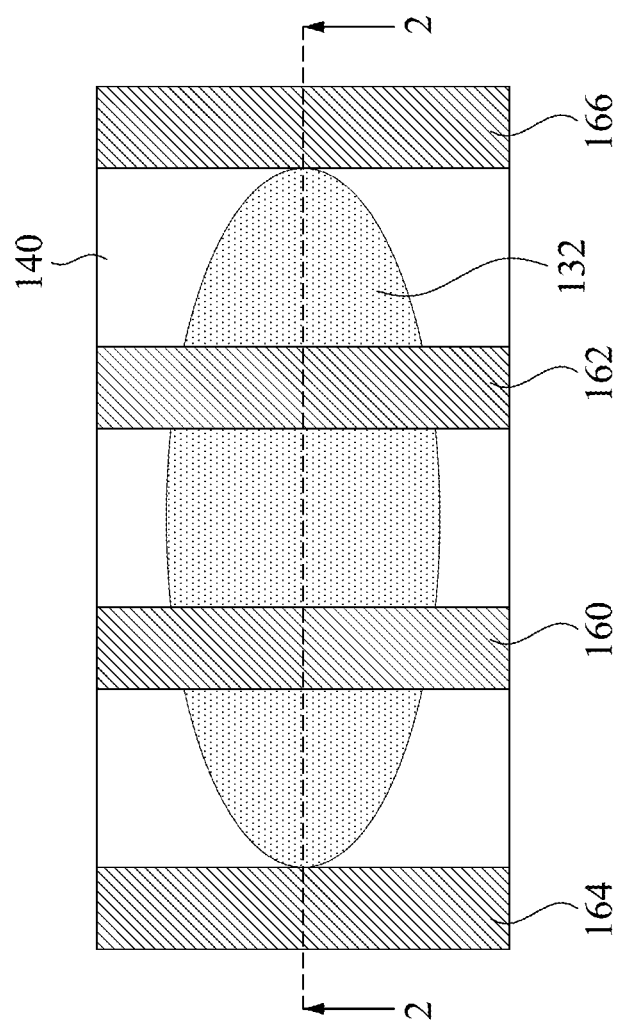
FIG. 1 is a top view of a semiconductor structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
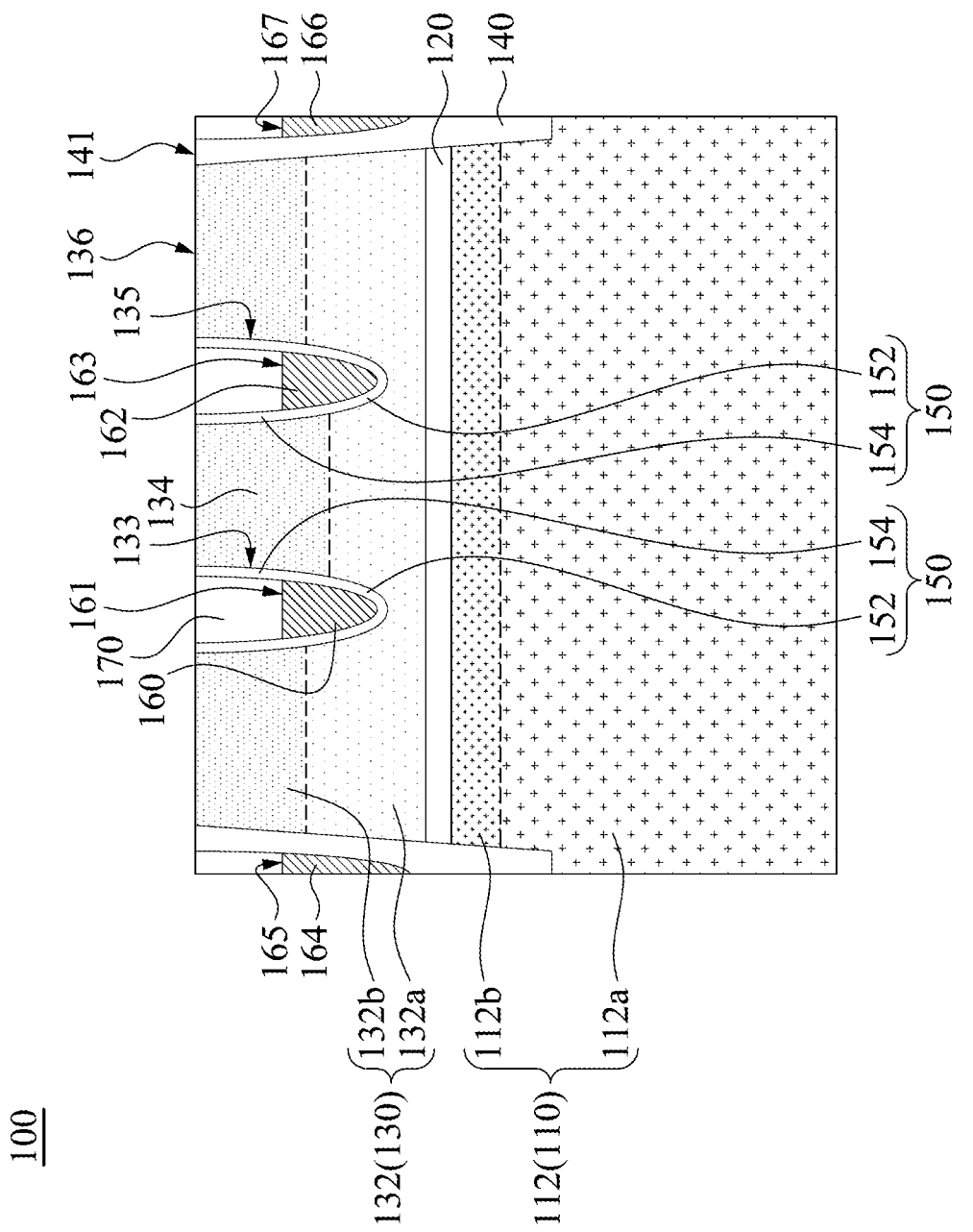
FIG. 2 is a cross-sectional view of the semiconductor structure taken along line 2-2 of FIG. 1.

FIG. 1 is a top view of a semiconductor structure 100 in accordance with one embodiment of the present disclosure, and FIG. 2 is a cross-sectional view of the semiconductor structure 100 taken along line 2-2 of FIG. 1. Referring to FIG. 1 and FIG. 2, the semiconductor structure 100 includes a first semiconductor substrate 110, a depletion layer 120, a second semiconductor substrate 130, an isolation structure 140, a first gate structure 160, and a second gate structure 162. The first semiconductor substrate 110 has a first active region 112, and the second semiconductor substrate 130 has a second active region 132. The second active region 132 overlaps the first active region 112. The depletion layer 120 is disposed between the first active region 112 and the second active region 132. In greater details, the first active region 112 and the second active region 132 are separated apart by the depletion layer 120. The isolation structure 140 surrounds the first active region 112 and the second active region 132. In greater details, the isolation structure 140 is in contact with the first active region 112, the depletion layer 120, and the second active region 132. The first gate structure 160 is disposed in the second active region 132. The second gate structure 162 is disposed in the second active region 132. The second active region 132 has a portion 134 between the first gate structure 160 and the second gate structure 162. In other words, the first gate structure 160 and the second gate structure 162 are separated apart from by the portion 134 of the second active region 132. The first gate structure 160 and the second gate structure 162 may serve as word lines (WL). As a result of such a configuration, higher driving current and lower threshold voltage sensitivity can be achieved, thereby improving the performance and the stability of the semiconductor structure 100.

In the present embodiments, the first active region 112 has a first doped region 112a and a second doped region 112b on the first doped region 112a, and a doping concentration of the second doped region 112b is higher than a doping concentration of the first doped region 112a. In some embodiments, a dopant of the first doped region 112a is same as a dopant of the second doped region 112b. For example, the dopant of the first doped region 112a and the dopant of the second doped region 112b are P-type dopants, such as boron (B), indium (In), or other P-type materials. The second doped region 112b is a highly P-type doped region, while the first doped region 112a is a lightly P-type doped region.

In the present embodiments, the second active region 132 has a third doped region 132a and a fourth doped region 132b on the third doped region 132a, and a doping concentration of the fourth doped region 132b is higher than a doping concentration of the third doped region 132a. In some embodiments, a dopant of the third doped region 132a is same as a dopant of the fourth doped region 132b. For example, the dopant of the third doped region 132a and the dopant of the fourth doped region 132b are N-type dopants, such as arsenic (As), antimony (Sb), phosphorous (P), or other N-type materials. The fourth doped region 132b is a highly N-type doped region, while the third doped region 132a is a lightly N-type doped region.

In some embodiments, the semiconductor structure 100 further includes a gate dielectric layer 150 between the first gate structure 160 and a sidewall 133 of the second active region 132. The gate dielectric layer 150 is also disposed between the second gate structure 162 and another sidewall 135 of the second active region 132. In greater details, the gate dielectric layer 150 is in contact with the second active region 132, the first gate structure 160, and the second gate structure 162.

In some embodiments, the semiconductor structure 100 further includes a third gate structure 164 and a fourth gate structure 166 on the isolation structure 140. The third gate structure 164 and the fourth gate structure 166 may serve as passing word lines (PWL), while the first gate structure 160 and the second gate structure 162 may serve as word lines (WL). In some embodiments, a top surface 161 of the first gate structure 160 is below a top surface 136 of the second active region 132, and a top surface 163 of the second gate structure 162 is below the top surface 136 of the second active region 132. In some embodiments, the top surface 161 of the first gate structure 160 and the top surface 163 of the second gate structure 162 are at same horizontal level. In other embodiments, the top surface 161 of the first gate structure 160, the top surface 163 of the second gate structure 162, a top surface 165 of the third gate structure 164, and a top surface 167 of the fourth gate structure 166 are at same horizontal level.

In some embodiments, the semiconductor structure 100 further includes a dielectric structure 170 on the first gate structure 160 and the second gate structure 162. In greater details, the dielectric structure 170 is also disposed on the third gate structure 164 and the fourth gate structure 166.

In some embodiments, the gate dielectric layer 150 has a portion 152 between the dielectric structure 170 and the second active region 132. In some embodiments, the gate dielectric layer 150 has portions 154 among the first gate structure 160, the second gate structure 162, and the second active region 132. The portion 152 of the gate dielectric layer 150 directly connects the portion 154 of the gate dielectric layer 150.

In some embodiments, the semiconductor structure 100 includes two transistors. One portion, such as the middle portion, of the fourth doped region 132b of the second active region 132 serves as a common source region of the transistors. The other adjacent portions, such as the right and left portions, of the fourth doped region 132b of the second active region 132 serve as drain regions of the transistors.

As shown in FIG. 1, a lengthwise direction of the second active region 132 is perpendicular to a lengthwise direction of the first gate structure 160 and the second gate structure 162. For clarity, the dielectric structure 170 above the first gate structure 160, the second gate structure 162, the third gate structure 164, and the fourth gate structure 166 are not shown.

In some embodiments, a top surface 141 of the isolation structure 140 and the top surface 136 of the second active region 132 are at same horizontal level. In greater details, the top surface 141 of the isolation structure 140, the top surface 136 of the second active region 132, and a top surface of the dielectric structure 170 are at same horizontal level.

FIG. 3 to FIG. 8 are cross-sectional views of a method of forming a semiconductor structure 100 of FIG. 2 at various stages in accordance with one embodiment of the present disclosure.

Figure 3:
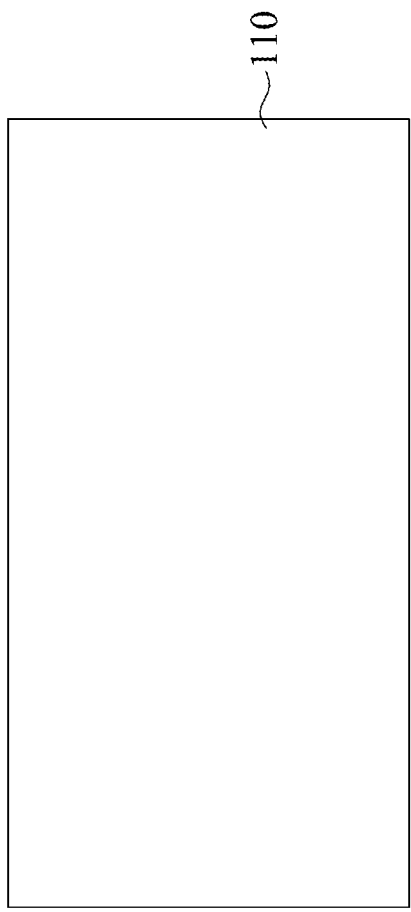
FIG. 3 to FIG. 8 are cross-sectional views of a method of forming a semiconductor structure at various stages in accordance with one embodiment of the present disclosure.
Figure 4:
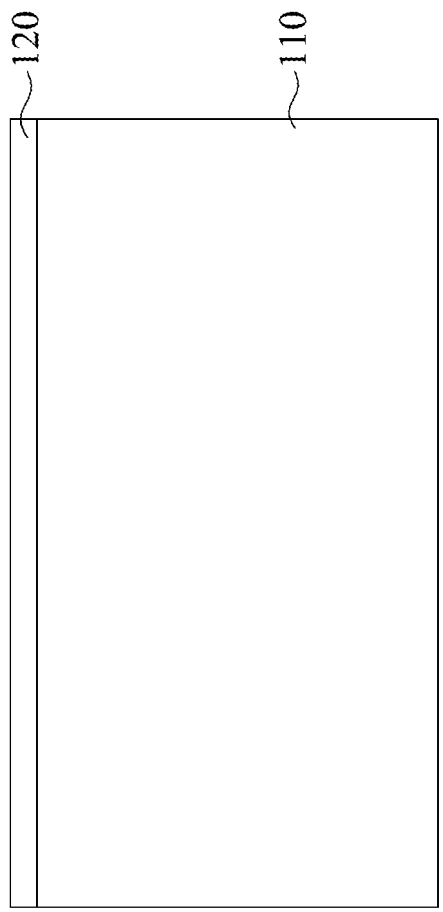
Figure 5:
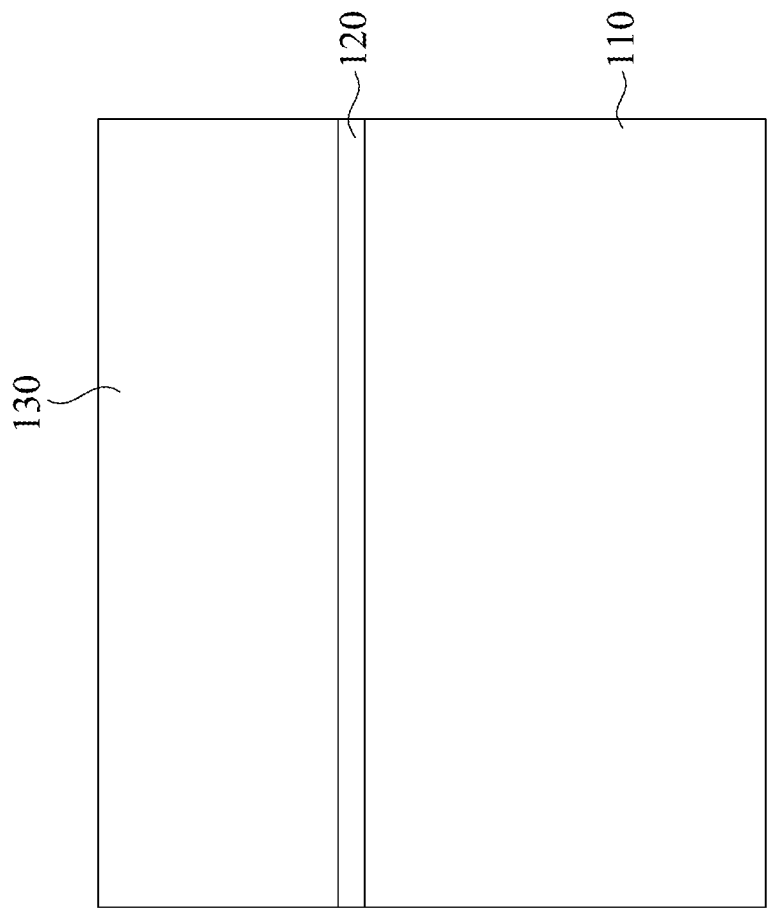

Referring to FIG. 3 to FIG. 5, the depletion layer 120 is formed on the first semiconductor substrate 110. Then, the second semiconductor substrate 130 is formed on the depletion layer 120. The depletion layer 120 has a thickness in a range from 1 nm to 2 nm. When the thickness of the depletion layer 120 is greater than 2 nm, the leakage current may occur and result in the poor performance and stability of the semiconductor structure. In the various embodiments, the thickness of the depletion layer 120 will vary depending on the doping concentrations and bias conditions for the semiconductor structure.

In some embodiments, the first semiconductor substrate 110 and the second semiconductor substrate 130 are silicon substrates. Alternatively, the first semiconductor substrate 110 and the second semiconductor substrate 130 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the depletion layer 120 is an oxide layer.

Figure 6:
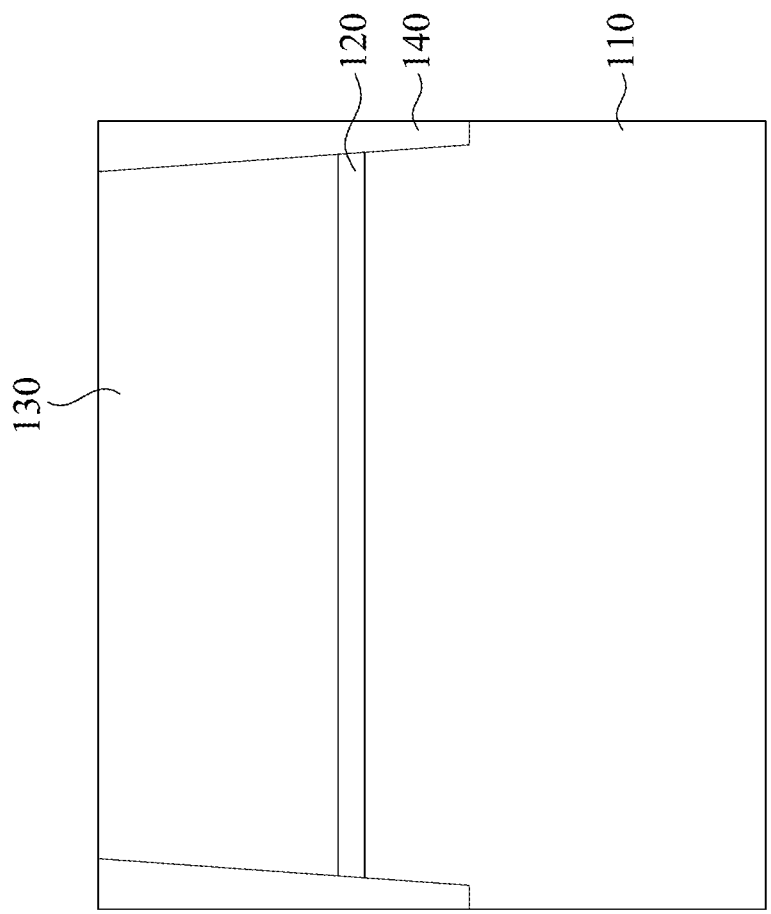

Referring to FIG. 6, the isolation structure 140 is formed in the second semiconductor substrate 130 and surrounds the second semiconductor substrate 130. In greater details, the second semiconductor substrate 130 is patterned before the isolation structure 140 is formed. For example, the second semiconductor substrate 130 may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process.

In some embodiments, the isolation structure 140 may be made of silicon oxide, silicon nitride or a silicon oxynitride, or other suitable materials. The isolation structure 140 may be a shallow trench isolation (STI) structure. The isolation structure 140 may be formed by physical vapor deposition (PVD), chemical vapor deposition (CVD), or the like.

Figure 7:
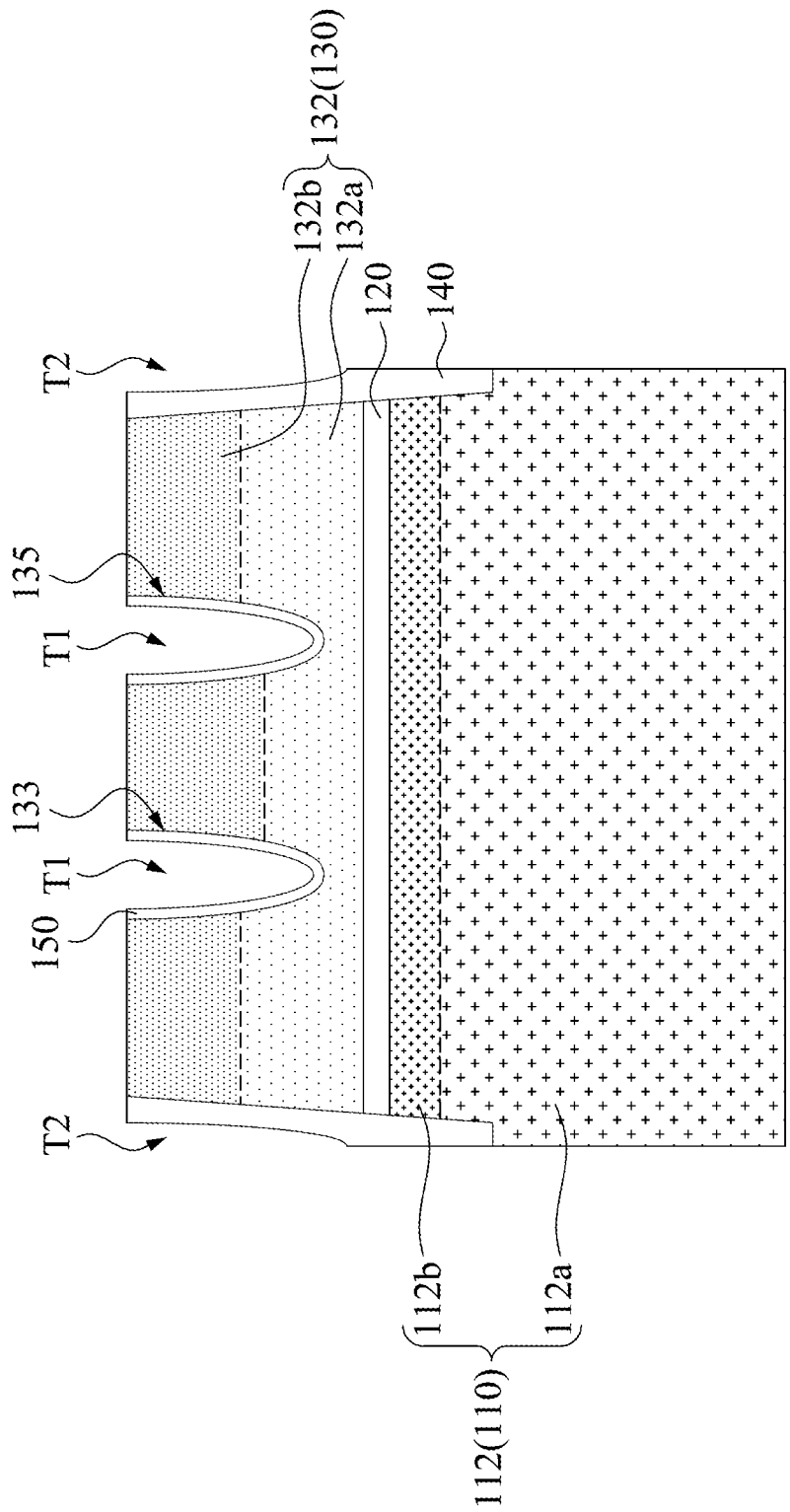

Referring to FIG. 7, two trenches T1 are formed in the second semiconductor substrate 130, and two trenched T2 are formed on the isolation structure 140. After the trenches T1 and T2 are formed, the first semiconductor substrate 110 and the second semiconductor substrate 130 are respectively doped to form the first doped region 112a of the first active region 112, the second doped region 112b of the first active region 112, the third doped region 132a of the second active region 132, and the fourth doped region 132b of the second active region 132. In greater details, the dopant of the first active region 112 is different from the dopant of the second active region 132. The doping concentration of the second doped region 112b is higher than the doping concentration of the first doped region 112a, and the doping concentration of the fourth doped region 132b is higher than the doping concentration of the third doped region 132a.

In some embodiments, the first semiconductor substrate 110 and the second semiconductor substrate 130 are respectively doped by controlling dopants of ion implantation, followed by an annealing process to activate the implanted dopants.

In some embodiments, the trenches T1 and T2 are formed by performing an etching process on the second semiconductor substrate 130. The etching process may include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

In some embodiments, the gate dielectric layer 150 is formed on the trenches T1 after the first semiconductor substrate 110 and the second semiconductor substrate 130 are doped. In other words, the gate dielectric layer 150 is formed on the sidewalls 133 and 135 of the second active region 132. In some embodiments, the gate dielectric layer 150 is further formed on a sidewall of the isolation structure 140.

In some embodiments, the gate dielectric layer 150 includes one or more layers of a dielectric material, such as silicon oxide, titanium nitride, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 150 may be formed by CVD, atomic layer deposition (ALD) or any suitable method. In one embodiment, the gate dielectric layer 150 is formed using a highly conformal deposition process such as ALD in order to ensure the formation of gate dielectric layer 150 having a uniform thickness.

Figure 8:
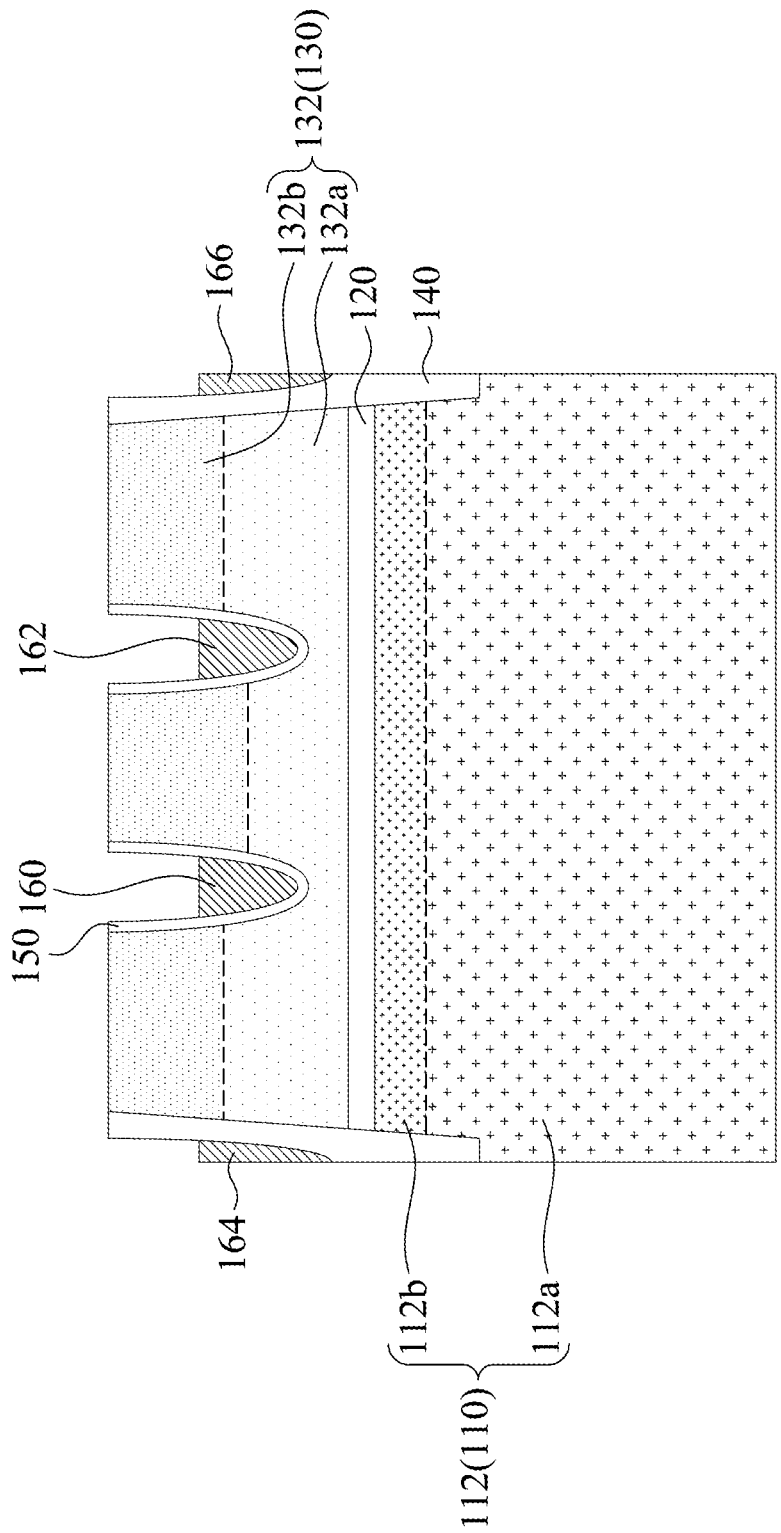

Referring to FIG. 8, the first gate structure 160 and the second gate structure 162 are respectively formed in the trenches T1 of FIG. 7, and the third gate structure 164, and the fourth gate structure 166 are respectively formed in the trenches T2 of FIG. 7.

In some embodiments, adhesion layers are formed in the trenches T1 and T2 before forming the first gate structure 160, the second gate structure 162, the third gate structure 164 and the fourth gate structure 166. The adhesion layers may respectively enable the first gate structure 160, the second gate structure 162, the third gate structure 164, and the fourth gate structure 166 to have improved filling characteristics in the trenches T1 and T2, and therefore results in forming the first gate structure 160, the second gate structure 162, the third gate structure 164, and the fourth gate structure 166 without leaving unfilled voids therein. In some embodiments, the adhesion layers may be made of titanium nitride (TiN).

In some embodiments, the method of forming the first gate structure 160, the second gate structure 162, the third gate structure 164, and the fourth gate structure 166 may include filling an adhesion material and a conductive material in the trenches T1 and T2 and then performing an etch-back operation. In some embodiments, the first gate structure 160, the second gate structure 162, the third gate structure 164, and the fourth gate structure 166 may be made of conductive materials such as tungsten or other suitable conductive materials. In some embodiments, the first gate structure 160 and the second gate structure 162 are made of same materials, and the third gate structure 164 and the fourth gate structure 166 are made of same materials. In other embodiments, the first gate structure 160, the second gate structure 162, the third gate structure 164, and the fourth gate structure 166 are made of same materials.

After the first gate structure 160, the second gate structure 162, the third gate structure 164, and the fourth gate structure 166 are formed, the dielectric structure 170 is respectively formed on the first gate structure 160, the second gate structure 162, the third gate structure 164, and the fourth gate structure 166. As a result, the semiconductor structure 100, as shown in FIG. 2 can be obtained.

In some embodiments, the dielectric structure 170 is made of silicon nitride or other suitable dielectric materials. In some embodiments, the dielectric structure 170 is formed by chemical vapor deposition CVD, ALD, or other suitable process.

In some embodiments, the method of forming the dielectric structure 170 may include forming the dielectric structure 170 to cover the gate structures (the first gate structure 160, the second gate structure 162, the third gate structure 164, and the fourth gate structure 166), the gate dielectric layer 150, and the isolation structure 140, and performing a planarization operation, such as a chemical mechanical polishing (CMP) method and/or an etch-back method such that a portion of the dielectric structure 170 is removed. In other words, a top surface of the dielectric structure 170, a top surface of the gate dielectric layer 150, and the top surface 141 of the isolation structure 140 are at same horizontal level.

In some embodiments, a contact, a first conductive component, and a second conductive component are formed on the second active region 132. In greater details, the contact, the first conductive component, and the second conductive component are respectively electrically connected to the fourth doped region 132b of the second active region 132. In other words, the contact is disposed between the first conductive component and the second conductive component. In some embodiments, the first conductive component and the second conductive component are capacitors.

In summary, because the semiconductor structure includes the first semiconductor substrate, the second semiconductor substrate, the depletion layer, the isolation structure, the first gate structure and the second gate structure, and the depletion layer is disposed between the first active region and the second active region, higher driving current and lower threshold voltage sensitivity can be achieved and short channel effect can be avoided. As a result, the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of forming a semiconductor structure, comprising:

forming a depletion layer on a first semiconductor substrate;

forming a second semiconductor substrate on the depletion layer;

forming an isolation structure in the second semiconductor substrate and surrounding the second semiconductor substrate;

forming two trenches in the second semiconductor substrate;

doping the first semiconductor substrate and the second semiconductor substrate to respectively form a first active region and a second active region, wherein a dopant of the first active region of the first semiconductor substrate is different from a dopant of the second active region of the second semiconductor substrate; and forming a first gate structure and a second gate structure respectively in the two trenches.

2. The method of forming the semiconductor structure of claim 1, further comprising:

forming a gate dielectric layer on a sidewall of the second active region of the second semiconductor substrate before forming the first gate structure and the second gate structure.

3. The method of forming a semiconductor structure of claim 2, further comprising:

forming a dielectric structure on the first gate structure and the second gate structure.

4. The method of forming the semiconductor structure of claim 3, wherein forming the dielectric structure is such that the gate dielectric layer has a portion between the dielectric structure and the second active region of the second semiconductor substrate.

5. The method of forming the semiconductor structure of claim 2, wherein forming the first gate structure and the second gate structure is such that the gate dielectric layer has portions among the first gate structure, the second gate structure, and the second active region of the second semiconductor substrate.

* * * * *